US012805247B2

(12) United States Patent
Shackleton et al.

(10) Patent No.: US 12,805,247 B2
(45) Date of Patent: Nov. 17, 2026

(54) PLANARIZATION PROCESS, PLANARIZATION SYSTEM AND METHOD OF MANUFACTURING AN ARTICLE

(71) Applicant: CANON KABUSHIKI KAISHA, Tokyo (JP)

(72) Inventors: Steven C. Shackleton, Austin, TX (US); Seth J. Bamesberger, Austin, TX (US); Masaki Saito, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/409,322

(22) Filed: Jan. 10, 2024

(65) Prior Publication Data

US 2024/0145269 A1 May 2, 2024

Related U.S. Application Data

(63) Continuation of application No. 17/039,650, filed on Sep. 30, 2020, now Pat. No. 11,908,711.

(51) Int. Cl.
*H10P 72/00* (2026.01)

(52) U.S. Cl.
CPC ...... *H10P 72/0448* (2026.01); *H10P 72/0428* (2026.01); *H10P 72/0436* (2026.01); *H10P 72/0616* (2026.01)

(58) Field of Classification Search
CPC ........... H01L 21/6715; H01L 21/67092; H01L 21/67115; H01L 21/67288; H01L 21/31051
See application file for complete search history.

(56) References Cited

U.S. PATENT DOCUMENTS

2004/0189986 A1 9/2004 Chen
2007/0110893 A1* 5/2007 Lennon .................... B41J 3/407 427/532
2007/0290150 A1 12/2007 Krupyshev
2010/0031833 A1* 2/2010 Kasumi ................ G03F 7/0002 101/4

(Continued)

FOREIGN PATENT DOCUMENTS

CN 105027258 A 11/2015
CN 105637669 A 6/2016

(Continued)

OTHER PUBLICATIONS

Chen Huimin et al., Short-range laser detection technology, Nov. 2018, vol. 1, pp. 319-321.

*Primary Examiner* — Mohammed Shamsuzzaman
(74) *Attorney, Agent, or Firm* — Canon U.S.A., Inc. IP Division

(57) ABSTRACT

A method of planarizing a substrate comprises dispensing formable material onto a substrate, contacting, at a planarizing station at a first location, a superstrate held by a superstrate chuck with the formable material on the substrate, thereby forming a multilayer structure including the superstrate, a film of the formable material, and the substrate, releasing the superstrate from the superstrate chuck, moving the multilayer structure from the first location to a curing station located at a second location away from the first location, the curing station including an array of light-emitting diodes, and curing the film of the multilayer structure by exposing the film to light emitted from the array of light-emitting diodes.

19 Claims, 8 Drawing Sheets

(56) References Cited

U.S. PATENT DOCUMENTS

| | | | | |
|---|---|---|---|---|
| 2012/0141659 | A1* | 6/2012 | Sato | B05D 3/067 118/712 |
| 2012/0188536 | A1* | 7/2012 | Sato | G01N 21/94 118/712 |
| 2014/0211105 | A1* | 7/2014 | Cho | G02F 1/13338 156/60 |
| 2015/0048050 | A1 | 2/2015 | Sreenivasan | |
| 2019/0227437 | A1* | 7/2019 | Resnick | C03C 17/22 |
| 2020/0007888 | A1 | 1/2020 | Xu | |
| 2020/0126804 | A1 | 4/2020 | Dole | |
| 2020/0142299 | A1* | 5/2020 | Norikane | G03F 7/0002 |

FOREIGN PATENT DOCUMENTS

| | | | | | |
|---|---|---|---|---|---|
| CN | 105810153 | B | * | 6/2019 | G09G 3/3426 |
| CN | 110156343 | A | | 8/2019 | |
| JP | 2003197699 | A | | 7/2003 | |
| JP | 2008183810 | A | | 8/2008 | |
| JP | 2009025345 | A | | 2/2009 | |
| JP | 2010040879 | A | | 2/2010 | |
| JP | 2016133640 | A | | 7/2016 | |
| JP | 2018006387 | A | | 1/2018 | |
| JP | 2018080260 | A | | 5/2018 | |
| JP | 2019516249 | A | | 6/2019 | |
| JP | 2019181453 | A | | 10/2019 | |
| JP | 2019212690 | A | | 12/2019 | |
| JP | 2020008841 | A | | 1/2020 | |
| JP | 2020061490 | A | | 4/2020 | |
| JP | 2020077671 | A | | 5/2020 | |
| JP | 2020521320 | A | | 7/2020 | |
| KR | 20100018458 | A | | 2/2010 | |
| KR | 20200051493 | A | | 5/2020 | |
| WO | WO-2012022561 | A1 | * | 2/2012 | G01N 21/94 |

* cited by examiner

PLANARIZATION PROCESS, PLANARIZATION SYSTEM AND METHOD OF MANUFACTURING AN ARTICLE

CROSS-REFERENCE TO RELATED APPLICATIONS

This application is a Continuation of U.S. application Ser. No. 17/039,650, filed Sep. 30, 2020, which is hereby incorporated by reference herein.

BACKGROUND

Field of Art

The present disclosure relates to substrate processing, and more particularly, to planarization of surfaces in semiconductor fabrication.

Description of the Related Art

Planarization techniques are useful in fabricating semiconductor devices. For example, the process for creating a semiconductor device includes repeatedly adding and removing material to and from a substrate. This process can produce a layered substrate with an irregular height variation (i.e., topography), and as more layers are added, the substrate height variation can increase. The height variation has a negative impact on the ability to add further layers to the layered substrate. Separately, semiconductor substrates (e.g., silicon wafers) themselves are not always perfectly flat and may include an initial surface height variation (i.e., topography). One method of addressing this issue is to planarize the substrate between layering steps. Various lithographic patterning methods benefit from patterning on a planar surface. In ArFi laser-based lithography, planarization improves depth of focus (DOF), critical dimension (CD), and critical dimension uniformity. In extreme ultraviolet lithography (EUV), planarization improves feature placement and DOF. In nanoimprint lithography (NIL) planarization improves feature filling and CD control after pattern transfer.

A planarization technique sometimes referred to as inkjet-based adaptive planarization (IAP) involves dispensing a variable drop pattern of polymerizable material between the substrate and a superstrate, where the drop pattern varies depending on the substrate topography. A superstrate is then brought into contact with the polymerizable material after which the material is polymerized on the substrate, and the superstrate removed. Improvements in planarization techniques, including IAP techniques, are desired for improving, e.g., whole wafer processing and semiconductor device fabrication.

In certain known imprint/planarization systems and methods, a curing step is performed by transmitting UV light radiation through a transparent superstrate chuck. Curing through the transparent superstrate chuck can result in non-uniform transmission of UV light radiation to formable material located between the superstrate and a substrate because of the structure of the superstrate chuck. The non-uniformity transmission can lead to unsatisfactory curing performance. Furthermore, in systems where the UV light radiation is transmitted through a transparent superstrate chuck, numerous optical components (e.g., dichroic mirrors, beam combiners, prisms, lenses, mirrors, etc.) are used to direct the UV light radiation. This results in large high profile systems with significant cost. Thus, there is a need in the art for a planarization systems and methods that prevent these disadvantages.

SUMMARY

A method of planarizing a substrate comprises dispensing formable material onto a substrate, contacting, at a planarizing station at a first location, a superstrate held by a superstrate chuck with the formable material on the substrate, thereby forming a multilayer structure including the superstrate, a film of the formable material, and the substrate, releasing the superstrate from the superstrate chuck, moving the multilayer structure from the first location to a curing station located at a second location away from the first location, the curing station including an array of light-emitting diodes, and curing the film of the multilayer structure by exposing the film to light emitted from the array of light-emitting diodes.

A planarization system comprises a substrate chuck configured to hold a substrate, a superstrate chuck configured to hold a superstrate, a positioning stage, a dispensing system configured to dispense formable material on the substrate, a planarizing station configured to contact, at a first location, the dispensed formable material on the substrate with the superstrate to form a multilayer structure including the superstrate, a film of the formable material, and the substrate, and a curing station located at a second location away from the first location, the curing station including an array of light-emitting diodes, wherein the superstrate chuck is further configured to release the superstrate, wherein the positioning stage is configured to move the multilayer structure from the planarizing station to the curing station after the superstrate has been released, and wherein, when the multilayer structure is located at the curing station, the curing station is configured to cure the film of the multilayer structure by exposing the film to light emitted from the array of light-emitting diodes.

A method of manufacturing an article comprises dispensing formable material onto a substrate, contacting, at a planarizing station at a first location, a superstrate held by a superstrate chuck with the formable material on the substrate, thereby forming a multilayer structure including the superstrate, a film of the formable material, and the substrate, releasing the superstrate from the superstrate chuck, moving the multilayer structure from the first location to a curing station located at a second location away from the first location, the curing station including an array of light-emitting diodes, curing the film of the multilayer structure by exposing the film to light emitted from the array of light-emitting diodes, and processing the cured film to make the article.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present disclosure can be understood in detail, a more particular description of embodiments of the disclosure may be had by reference to the embodiments illustrated in the appended drawings. It is to be noted, however, that the appended drawings only illustrate typical embodiments of the disclosure and are therefore not to be considered limiting of its scope, for the disclosure may admit to other equally effective embodiments.

While the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Planarization System

Figure 1:
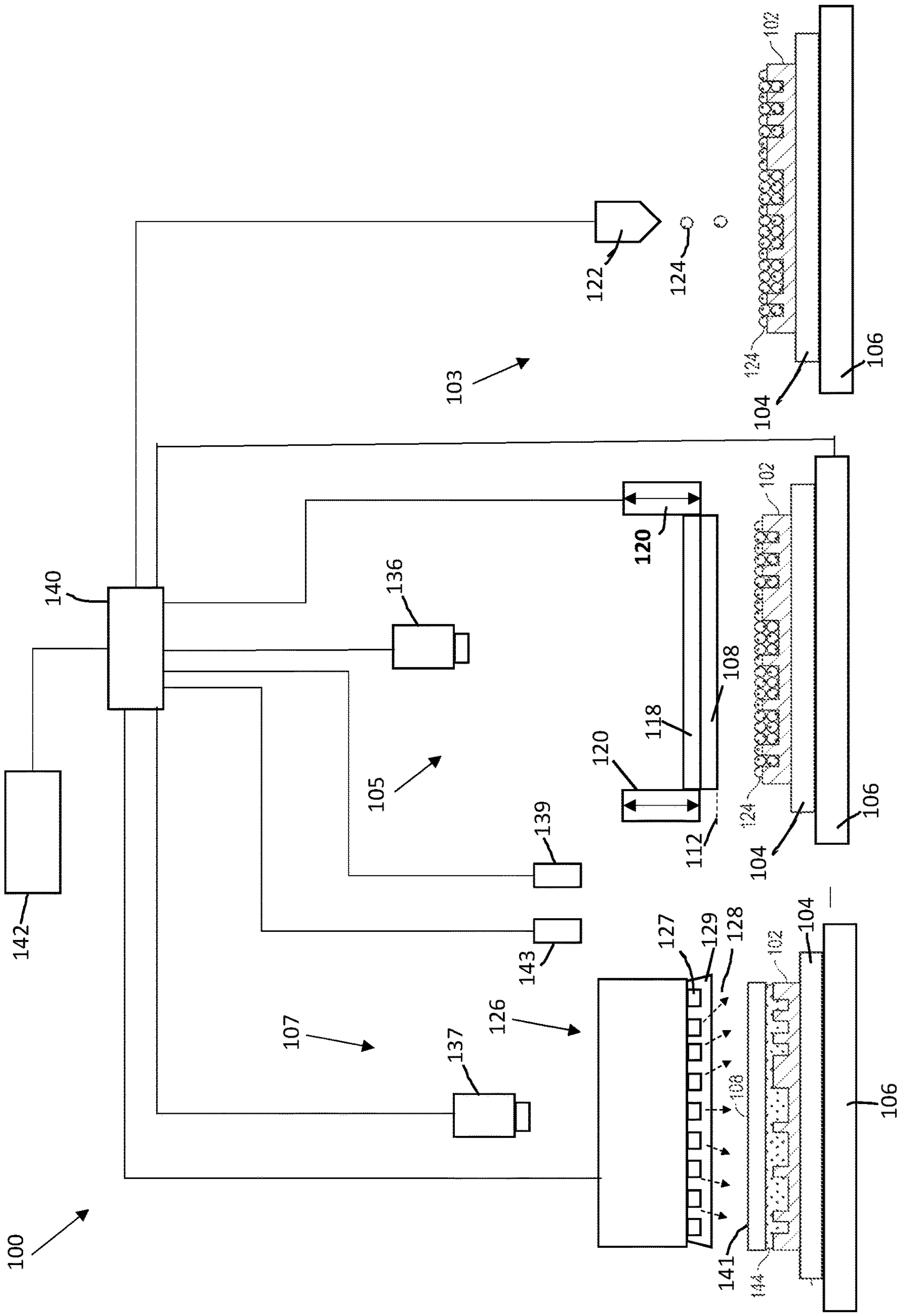
FIG. 1 is a schematic illustration of an example planarization system in accordance with an aspect of the present disclosure.

FIG. 1 illustrates an example system for planarization in accordance with an aspect of the present disclosure. The planarization system 100 is used to planarize a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x-, y-, z-, θ-, ψ-, and φ-axes. The substrate positioning stage 106, the substrate 102, and the substrate chuck 104 may also be positioned on a base (not shown). The substrate positioning stage 106 may be a part of a positioning system.

As shown in FIG. 1, in an example embodiment, the planarization system 100 may include three separate stations: a dispensing station 103, a planarizing station 105, and a curing station 107. The three stations may be located at different locations. The stage 106 may be capable of travelling along a rail 109 (FIGS. 3B, 3E-3J) to carry the substrate 102 to each of the three stations. In another example embodiment, the substrate 102 and substrate chuck 104 may be carried to the various stations via a robot arm. In the example embodiment discussed below in more detail with respect to FIGS. 3A to 3J, the planarizing station 105 is located at a first location and the curing station 107 is located at a second location that is different from the first location, but the two locations may be contained within a common housing 114 (FIGS. 3B, 3E-3J).

The dispensing station 103 of the planarization system 100 may comprise a fluid dispenser 122. The fluid dispenser 122 may be used to deposit droplets of liquid formable material 124 (e.g., a photocurable polymerizable material) onto the substrate 102 with the volume of deposited material varying over the area of the substrate 102 based on at least in part upon its topography profile. Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids. In the illustrated example embodiment, because the substrate 102 is brought to the dispensing station 103, and because the dispensing station 103 is a different location than the planarizing station 105 and the curing station 107, the fluid dispensers 122 may be stationary.

As shown in FIG. 1, the planarizing station 105 of the planarization system 100 may comprise a superstrate 108 having a working surface 112 facing and spaced apart from the substrate 102. The superstrate 108 may be formed from materials including, but not limited to, fused silica, quartz, silicon, organic polymers, siloxane polymers, borosilicate glass, fluorocarbon polymers, metal, hardened sapphire, and/or the like. In an embodiment the superstrate 108 is readily transparent to UV light radiation. The surface 112 is generally of the same areal size as or slightly larger than the surface of the substrate 102.

The planarizing station 105 may further include a superstrate chuck 118 and a planarization head 120 which is part of the positioning system. The superstrate 108 may be coupled to or retained by the superstrate chuck 118. The superstrate chuck 118 may be coupled to the planarization head 120. The planarization head 120 may be movably coupled to a bridge. The planarization head 120 may include one or more actuators such as voice coil motors, piezoelectric motors, linear motor, nut and screw motor, etc., which are configured to move the superstrate chuck 118 relative to the substrate 102 in at least the z-axis direction, and potentially other directions (e.g. x-, y-, θ-, ψ-, and φ-axis). In operation, either the planarization head 120, the substrate positioning stage 106, or both vary a distance between the superstrate 108 and the substrate 102 to define a desired space (a bounded physical extent in three dimensions) that is filled with the formable material 124. For example, the planarization head 120 may be moved toward the substrate and may apply a force to the superstrate 108 such that the superstrate contacts and spreads droplets of the formable material 124 as further detailed herein.

The planarizing station 105 may further comprise a camera 136 positioned to view the spread of formable material 124 as the superstrate 108 contacts the formable material 124 during the planarizing process. The camera 136 may include one or more of a CCD, a sensor array, a line camera, and a photodetector which are configured to gather light at a wavelength that shows a contrast between regions underneath the superstrate 108 and in contact with the formable material 124 and regions underneath the superstrate 108 but not in contact with the formable material 124. The camera 136 may be configured to provide images of the spread of formable material 124 underneath the superstrate 108, and/or the separation of the superstrate 108 from cured formable material 124. The camera 136 may also be configured to measure interference fringes, which change as the formable material 124 spreads between the gap between the surface 112 and the substrate surface.

In another example embodiment, the dispensing station 103 and the planarizing station 105 may be integrated into a single station. In such an embodiment, the fluid dispenser 122 may be movably coupled to the bridge. In an embodiment, the fluid dispenser 122 and the planarization head 120 share one or more of all positioning components. In an alternative embodiment, the fluid dispenser 122 and the planarization head move independently from each other. When the dispensing station 103 and the planarizing station 105 are integrated into a single station, the fluid dispenser 122 and the planarization head 120 are moveable so that each can perform their respective functions without interfering with each other.

As noted above, the curing station 107 may be located at a different location than the planarizing station 105. As discussed in more detail below, following the forming of the formable material film 144 at the planarizing station 105, the substrate 102 having a formable material film 144 and the superstrate 108 thereon, will travel to the curing station 107. The curing station 107 includes a radiation source 126 that directs actinic energy, for example, UV light radiation, along an exposure path 128. In an example embodiment the radiation source 126 comprises an array of light emitting diodes (LEDs) 127 and a diffuser 129. The array of LEDs 127 and diffuser 129 may be configured such that the emitted light is distributed at 80% or greater uniformity across the substrate 102. The diffuser 129 may be positioned proximate the light output of the LEDs to assist in achieving the target uniformity. The wavelength of the light emitted may be 300 to 400 nm. The stage 106 and rail 109 may be configured to position the substrate 102 and the superstrate 108, with the formable material film 144 in between, in superimposition with the exposure path 128. The array of LEDs 127, in combination with the diffuser 129, transmits the actinic energy along the exposure path 128. In this manner, the actinic energy is uniformly applied to the formable material film 144. Notably, the curing station 107 does not include (is free from) additional optical components (e.g., dichroic mirrors, beam combiners, prisms, lenses, mirrors, etc.). That is, the array of LEDs 127 and the diffuser 129 is all that is needed to direct sufficient actinic energy uniformly across the surface area formable material film. The curing station 107 may further include a camera 137 for data collection and monitoring with respect to the curing process. For example, the camera 137 may capture incomplete local cure such as when one or more LEDs of the array of LEDs 127 fails.

The planarization system 100 may further include a detector 139 configured to detect one or more or all of the following after the planarizing step is completed at the planarizing station 105: a) particles located between the superstrate 108 and the substrate 102, b) incomplete spread of the formable material 124, c) particles located on the upper surface 141 of the superstrate 108 (i.e., the surface opposite the surface facing the formable material film 144), d) scratches located on the upper surface 141 of the superstrate 108.

With regard to detecting particles between the superstrate 108 and the substrate 102 or detecting incomplete spread of formable material 124, if such defects are detected prior to the curing, the curing can be aborted and the substrate can be reclaimed by removing the formable material. Otherwise, if the curing is performed with these defects, the substrate 102 may potentially need to be discarded. In order to detect the particles between the superstrate 108 and the substrate 102, the detector 139 may use optical imaging via a line scan camera, scatterometer, or microscope, for example. With regard to detecting incomplete spread of the formable material 124, the detector 139 may use optical imaging via a line scan camera, a microscope, or fringe detection. The detector 139 may be used to determine whether the size and/or amount of particles exceeds predetermined threshold values. The predetermined threshold values may be selected based on the specifications of the particular fabrication. If the threshold is exceeded, then the curing may be aborted. Furthermore, in most cases if any amount of incomplete spread is detected by the detector 139, then the curing may be aborted. However, in some cases it is possible that the detector 139 has high enough resolution such that the detector 139 is able to detect a degree of incomplete spread that falls within an acceptable tolerance for the particular fabrication. In such a case, a predetermined threshold value may be used to determine when to abort the curing process.

With regard to detecting particles and scratches on the upper surface 141 of the superstrate 108, the detector may similarly use a line scan camera, scatterometer, or microscope, for example. Particles located on the upper side surface 141 of the superstrate 108 can negatively impact the flatness of the superstrate chucking and the particles may also migrate to the substrate 102 or substrate chuck 104, negatively impacting the resulting planarization of formable material. Scratches on the upper side surface 141 of the superstrate 108 may indicate wear and/or particle generation, may indicate that the superstrate 108 needs replacing, and/or may negatively impact the curing of the formable material 124. In the case of scratch detection on the upper side surface 141 of the superstrate 108, if the amount and/or size of scratches surpasses a predetermined threshold value, the superstrate 108 may be replaced. The detector 139 may be used to determine whether the size and/or amount of scratches exceeds predetermined threshold values. The predetermined threshold values may be selected based on the specifications of the particular fabrication. If the predetermined threshold value is exceeded, then the superstrate 108 may be replaced. In the case of particle detection on the upper side surface 141 of the superstrate 108, the planarization system 100 may further include a particle removal device 143. The particle removal device 143 may be a vacuum or an electrostatic tool, for example. The particle removal device 143 may be operated to remove the detected particles. The detector 139 may be used to determine whether the size and/or amount of particles exceeds predetermined threshold values. The predetermined values may be selected based on the specifications of the particular fabrication. If the threshold is exceeded, then the particles may be removed using the particle removal device 144. In another embodiment the particle removal device 143 may be operated without first determining whether particles are present or regardless of whether particles are detected that exceed a predetermined threshold.

The planarization system 100 may be regulated, controlled, and/or directed by one or more processors 140 (controller) in communication with one or more components and/or subsystems such as the substrate chuck 104, the substrate positioning stage 106, the superstrate chuck 118, the fluid dispenser 122, the planarization head 120, the camera 136, the detector 139, the particle removal device 143, the radiation source 126, and/or the camera 137. The processor 140 may operate based on instructions in a computer readable program stored in a non-transitory computer memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device. All of the method steps described herein may be executed by the processor 140.

Planarization Method

Figure 2:
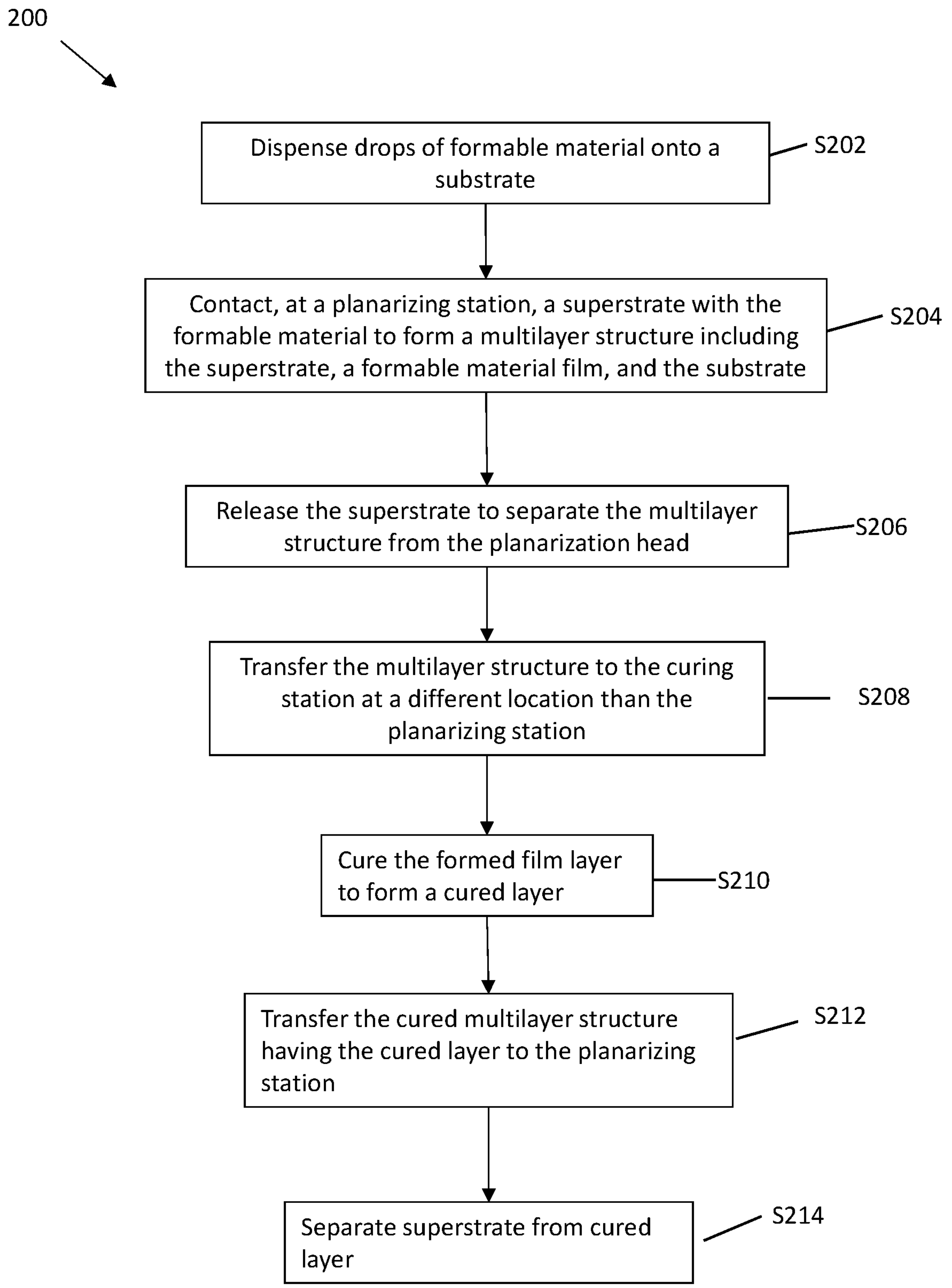
FIG. 2 is a flowchart of an example method of planarization in accordance with an aspect of the present disclosure.
Figure 3A:
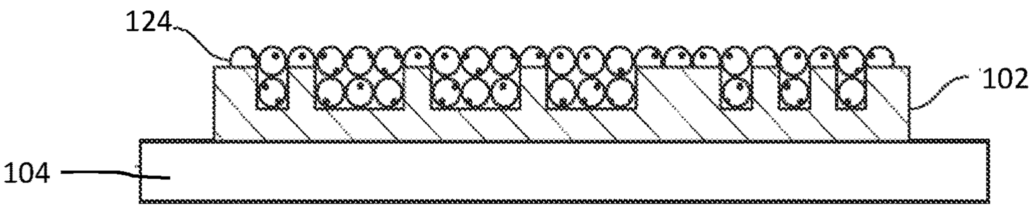
FIGS. 3A to 3K are schematic cross sections showing the planarization method of FIG. 2.

FIG. 2 shows a flow chart of a planarization method 200 in accordance with an example embodiment. FIGS. 3A to

3K show schematic cross sections of the operation of the planarization system 100 when performing the method 200. The planarization method 200 may begin with step S202, where formable material 124 is dispensed onto the substrate 102 in the form of droplets. As discussed above, the substrate 102 surface has some topography which may be known based on previous processing operations or may be measured using a profilometer, AFM, SEM, or an optical surface profiler based on optical interference effect like Zygo NewView 8200. The local volume density of the deposited formable material 124 is varied depending on the substrate topography. As also noted above, the step S202 may be performed at the dispensing station 103 that may be at a different location than either the planarizing station 105 or the curing station 107. FIG. 3A shows a schematic cross section of the substrate 102 after the formable material 124 has been dispensed, i.e., after the completion of step S202.

Figure 3B:
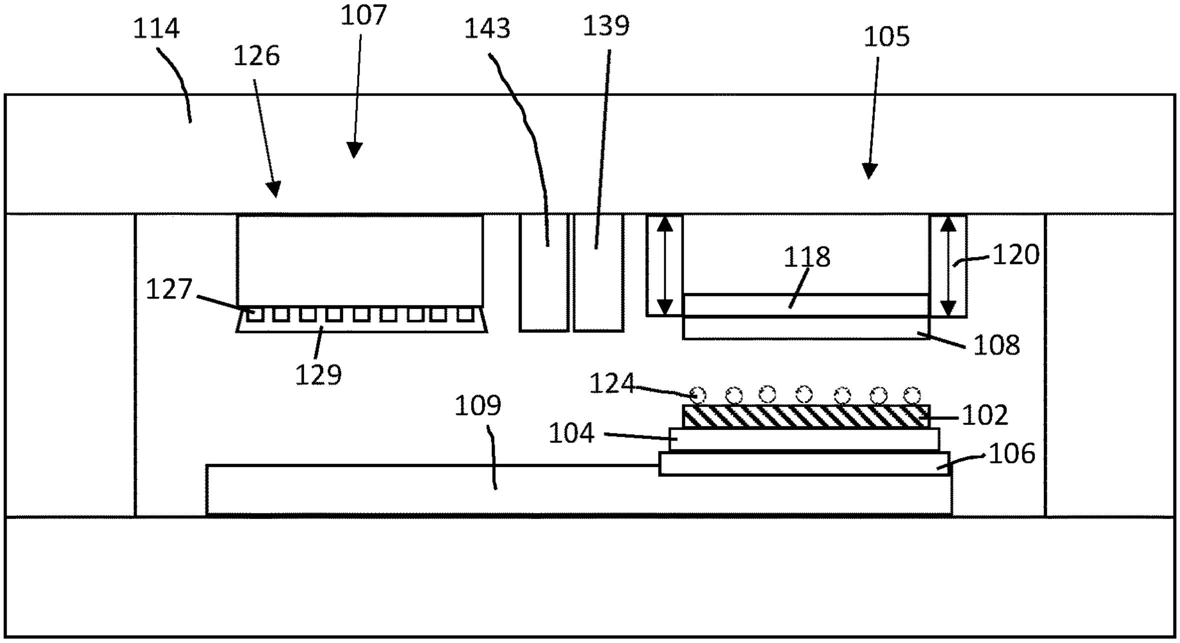

The planarization method 200 may then proceed to step S204, where the substrate 102 having the formable material 124 is planarized using the planarizing station 105 to form a multilayered structure 111. In the example embodiment where the planarizing station 105 is at a separate location from the dispensing station 103, the substrate 102 having the formable material 124 is first brought to the planarizing station 105. FIG. 3B shows a schematic cross section of a portion of the planarization system 100 after the substrate 102 having the formable material 124 has been placed at the planarizing station 105, but prior to planarizing. As shown in FIG. 3B, in an example embodiment, the planarizing station 105 and the curing station 107 may be oriented side-by-side within a common housing 114. As also shown in FIG. 3B, the rail 109 on which the stage 106 travels, may be coupled to the inside of the housing 114 and may extend from the planarizing station 105 to the curing station 107. As a result of this structural arrangement, the stage 106 may travel along the rail 109 to reach the planarizing station 105 and the curing station 107. The detector 139 and the particle removing device 143 may also be located within the housing 114 between the planarizing station 105 and the curing station 107. At the moment shown in FIG. 3B, the superstrate 108 is being held by the superstrate chuck 118 and has not yet come into contact with the formable material 124.

Figure 3C:
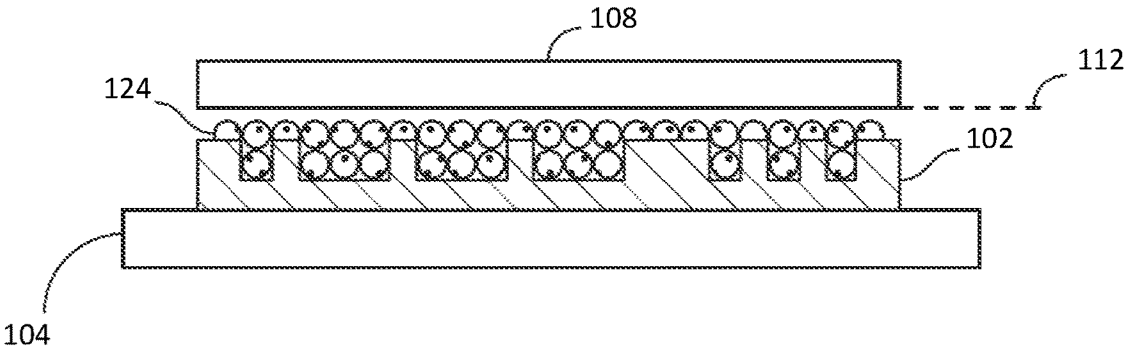
Figure 3D:
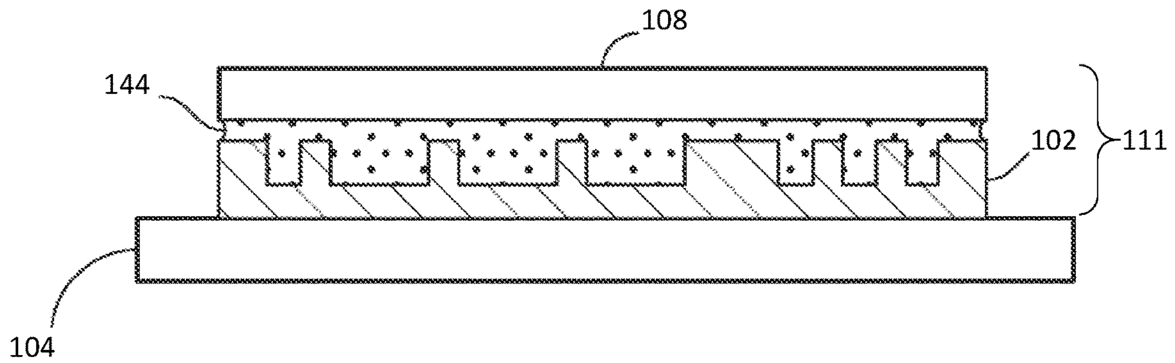

FIGS. 3C and 3D shows more detailed schematic cross sections of the interaction of the superstrate 108 with the formable material 124 that occurs during the step S204. FIG. 3C shows the moment just before the superstrate 108 comes into the contact with the formable material 124 on the substrate 102. As noted above, the planarization head 120 may be moved toward the substrate 102 and apply a force to the superstrate 108 such that the superstrate 108 contacts and spreads droplets of the formable material 124. FIG. 3D illustrates a post-contact step after the superstrate 108 has been brought into full contact with the formable material 124. As the superstrate 108 contacts the formable material 124, the droplets merge to form a formable material film 144 that fills the space between the superstrate 108 and the substrate 102. Preferably, the filling process happens in a uniform manner without any air or gas bubbles being trapped between the superstrate 108 and the substrate 102 in order to minimize non-fill defects. At the moment shown in the FIG. 3D, the step S204 has been completed. Furthermore, at this moment, while the superstrate 108 is still in contact with the formable material 124, a multilayer structure 111 has been formed. In particular, the multilayer structure comprises or consists of the superstrate 108, the formable material film 144, and the substrate 102, in that order. In another aspect, the multilayer structure may also be considered to comprise or consist of the superstrate 108, the formable material film 144, the substrate 102, and the substrate chuck 104, in that order. In either case, as shown in FIG. 3D, in the multilayer structure the underside surface 112 of the superstrate 108 is in direct contact with the upper surface of the formable material film 144, while the underside surface of the formable material film 144 is in direct contact with the upper surface of the substrate 102.

Figure 3E:
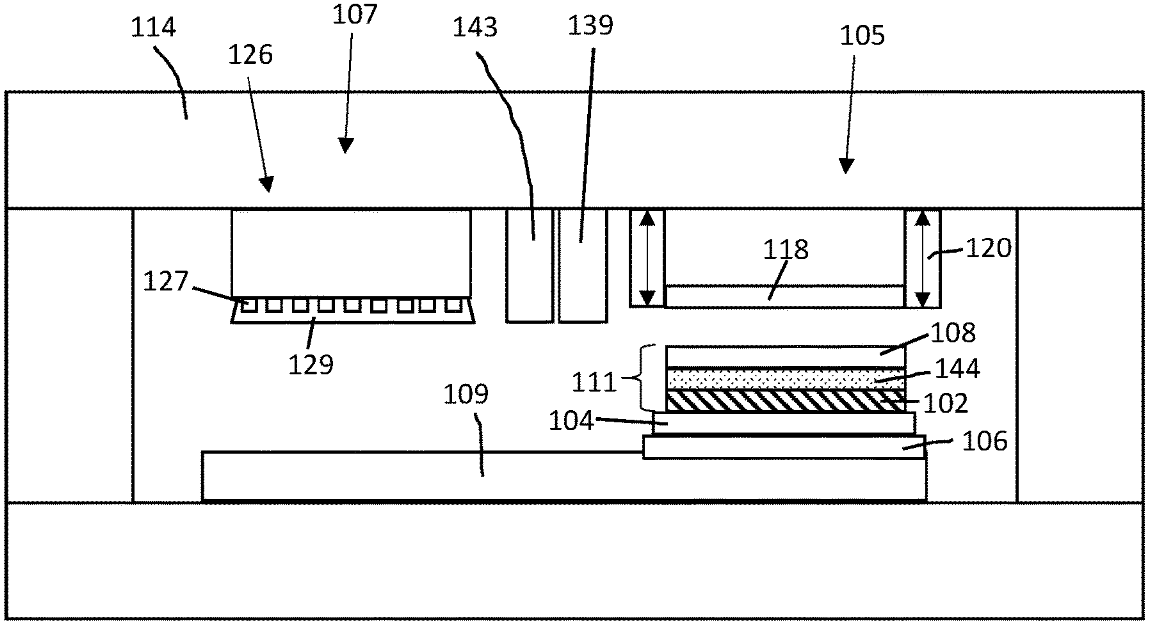

The method may then proceed to step S206, where the superstrate 108 is released from the superstrate chuck 118 while the superstrate 108 is still in contact with the formable material film 144. FIG. 3E shows a schematic cross section of the planarizing unit 105 and curing unit 107 in the housing 114 just after release of the substrate 108. This action of releasing the superstrate 108 from the superstrate chuck 118 leaves the multilayer structure 111 free from the planarization head 120. The releasing of the superstrate 108 from the superstrate chuck 118 may also be referred to as dechucking. Thus, as a result of releasing the superstrate 108 from the superstrate chuck 118, the multilayer structure 111 (i.e., the superstrate 108, the formable material film 144, and the substrate 102 in that order) is moveable along the rail 109 via the stage 106. As shown in FIG. 3E, just after release of the superstrate 108, the stage 106 carrying the multilayer structure 111 is still located at the planarizing unit 105.

The method may then proceed to step S208, where the multilayer structure 111 is transferred from the planarizing station 105 to the curing station 107. The transferring of the multilayer structure 111 may be performed by actuating the stage 106 to travel linearly along the rail 109 from the planarizing station 105 to the curing station 107. Because the stage 106 carries the multilayer structure 111 (via the substrate chuck 104), the movement of the stage 106 linearly along the rail 109 also moves the multilayer structure 111. Thus, in step S208 the multilayer structure 111 moves from a first location where the planarizing station 105 is located to a second location where the curing station 107 is located.

Figure 3F:
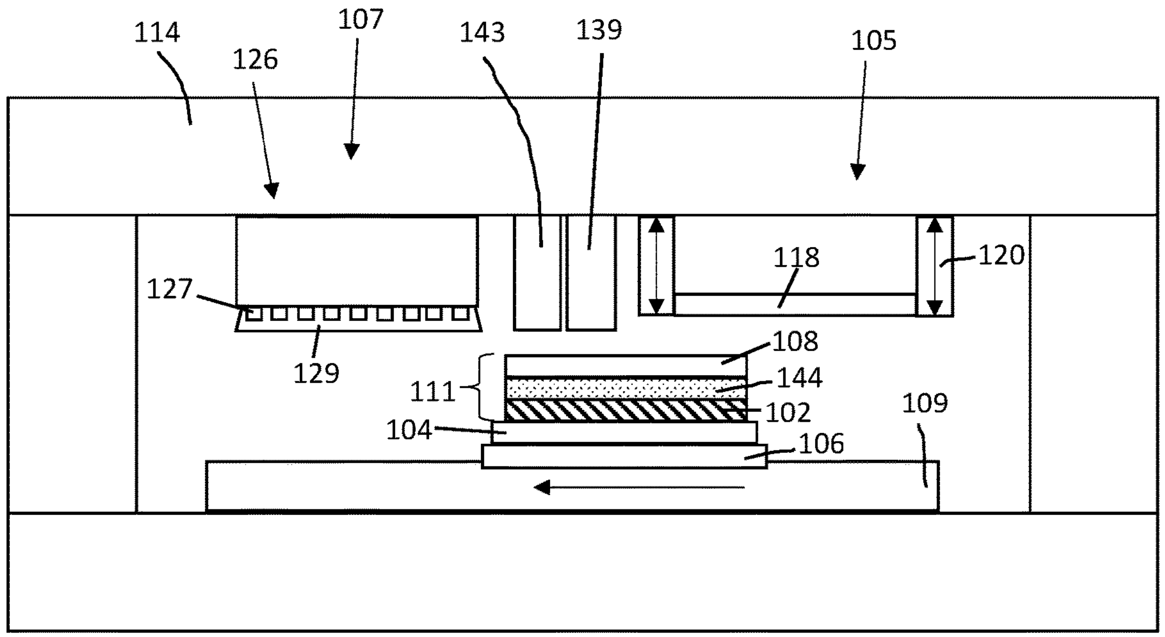

In one example embodiment, as the multilayer structure 111 travels along the rail 109, before arriving at the curing station 107, the multilayer structure may pass underneath the detector 139 followed by the particle removal device 143. FIG. 3F shows a schematic cross section of planarizing station 105 and the curing station 107 within housing 114 at a moment when the multilayer structure 111 is passing underneath the detector 139 and the particle removal device 143. As shown in FIG. 3F the detector 139 and the particle removal device 143 may be located an intermediate location between the first location of the planarizing station 105 and the second location of the curing station 107. As the multilayer structure 111 passes underneath the detector 139, the detector 139 may detect one or more or all of the conditions noted above. That is, the detector 139 may detect one or more or all of a) particles located between the superstrate 108 and the substrate 102, b) incomplete spread of the formable material, c) particles located on the upper surface 141 of the superstrate 108 (i.e., the surface opposite the surface facing the formable material film 144), d) scratches located on the upper surface 141 of the superstrate 108. As also noted above, if situation a) or b) is indeed detected by the detector 139 prior to the multilayer structure 111 reaching the curing station 107, the process may be stopped and the substrate 102 may be reclaimed by removing the formable material film 144. More particularly, if the detector 139 detects either situation a) and/or b) that exceeds the predetermined threshold values, then the process may be stopped and the substrate 102 may be reclaimed. In this case, the above steps may be repeated with a fresh substrate having formable material, which will only proceed to curing if conditions a) and b) are not detected. If situation c) is indeed detected by the detector 139 prior to the multilayer structure 111 reaching the curing station 107, then the particle removal device 143 is activated to remove the detected particles as the multilayer structure 111 passes underneath the particle removable device 143. More particularly, if the detector 139 detects situation c) that exceeds the predetermined threshold values, then the particle removal device 143 may be activated. In another example embodiment, the particle removal device 143 may be operated in all cases, with or without performing the detecting, regardless of whether particles are detected, and regardless if the detected particles exceed the predetermined threshold values. Furthermore, a second pass under the detector can be performed to confirm that the particles have been removed, such as when the cured multilayer structure is traveling back to the planarizing station 105 after the curing (see below). Or the second pass can be performed by reversing the direction of travel of the multilayer structure before continuing on to the curing station 107. If particles are still present, then the particle removal device 143 may be operated again. The detecting step and removal step can be repeated until the detector 139 no longer detects particles exceeding the predetermined threshold values. If situation d) is indeed detected by the detector 139 prior to the multilayer structure 111 reaching the curing station 107, then the process is stopped and the superstrate is replaced with a fresh one. More particularly, if the detector 139 detects situation d) that exceeds the predetermined threshold value, then the process may be stopped and the superstrate may be replaced. Then, the above steps may be repeated with the fresh superstrate and a fresh substrate having formable material thereon, which will only proceed to curing if condition d) is not detected.

Figure 3G:
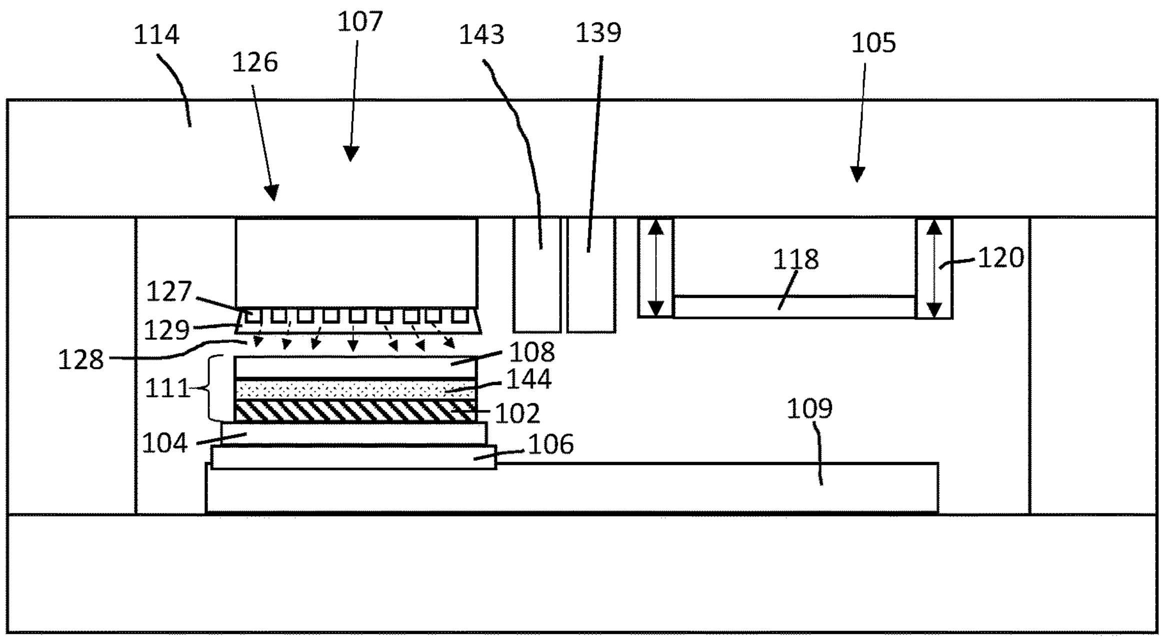

After the stage 106 carries the multilayer structure 111 to the curing station 107, the method may proceed to step S210, where the formed film layer 144 is cured. FIG. 3G shows a schematic cross section of planarizing station 105 and the curing station 107 within housing 114 at a moment when the multilayer structure 111 is underneath the radiation source 126 and the curing process has begun. The polymerization process or curing of the formable material 124 may be initiated with actinic radiation (e.g., UV light radiation). For example, radiation source 126 provide the actinic radiation causing formable material film 144 to cure, solidify, and/or cross-link, defining a cured layer 146 on the substrate 102. More particularly, as shown in FIG. 3G, the UV light radiation is emitted from the array of LEDs 127 that are directed toward the multilayer structure 111. The diffuser 129 spreads the UV light radiation emitted from the array of LEDs 127 uniformly across the surface of the multilayer structure 111 along the exposure path 128. Because the superstrate 108 is configured to be transparent with respect to the UV light radiation emitted from the array of LEDs 127, the UV light radiation passes through the superstrate 108 and acts upon the formable material film 144 to cure the formable material film 144 resulting in the cured layer 146. Furthermore, because the curing step occurs at a separate location than the planarizing step, the UV light radiation does not pass through the superstrate chuck 118. Thus, by not passing the UV light radiation through the superstrate chuck 118 the above-noted non-uniform transmission of UV light that occurs in other systems is avoided. Accordingly, the superstrate chuck 118 need not be transparent with respect to UV light radiation.

Figure 3H:
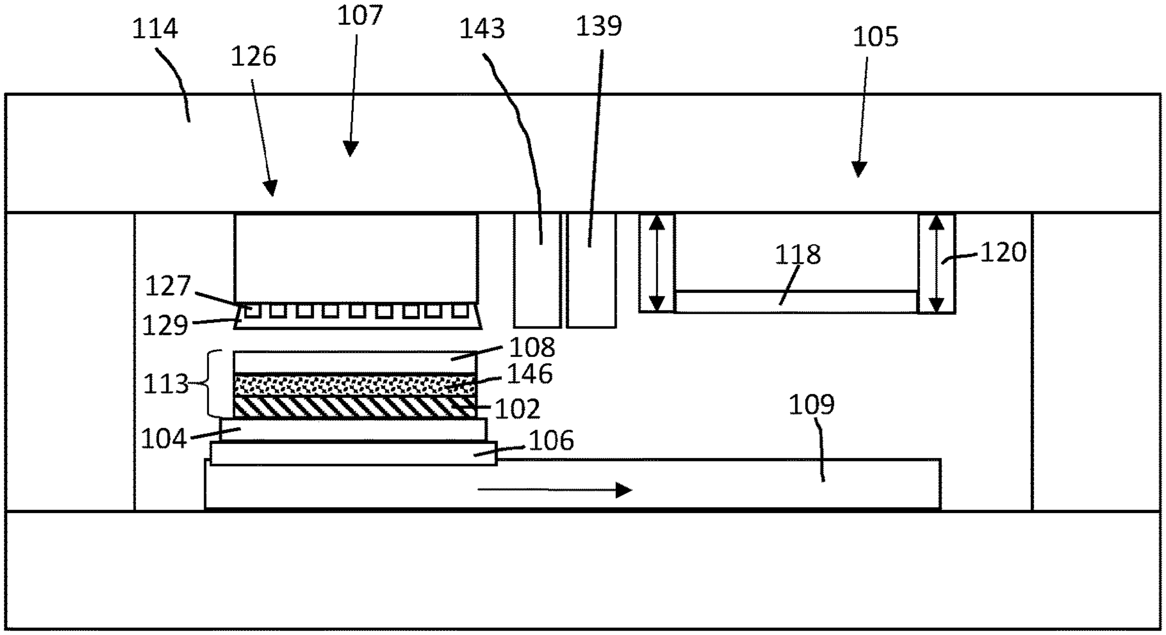

FIG. 3H shows a schematic cross section of planarizing station 105 and the curing station 107 within housing 114 at a moment when the curing process in complete. As shown in FIG. 3H, when the curing process is complete, the formable material film 144 has become a cured layer 146. Likewise, the multilayer structure 111 has become a cured multilayer structure 113. The cured multilayer structure 113 is different from the multilayer structure 111 in that the multilayer structure 111 comprises the formable material film 144 between the superstrate 108 and the substrate 102, while the cured multilayer structure 113 comprises the cured layer 146 between the superstrate 108 and the substrate 102. In other words, the cured multilayer structure 113 comprises or consists of the superstrate 108, the cured layer 146, and the substrate 102, in that order. In another aspect, the cured multilayer structure 113 may also be considered to comprise or consist of the superstrate 108, the cured layer 146, the substrate 102, and the substrate chuck 104, in that order.

The planarization method 200 may then proceed to step S212 where the cured multilayer structure 113 is transferred back to the planarizing station 105. The cured multilayer structure may be transferred back to the planarizing station 105 by controlling the stage 106 to travel linearly along the rail 109 in direction opposite to the travel direction in step S208. That is, the transferring of the cured multilayer structure 113 may be performed by actuating the stage 106 to travel linearly along the rail 109 from the curing station 107 to the planarizing station 105. Because the stage 106 carries the cured multilayer structure 113 (via the substrate chuck 104), the movement of the stage 106 linearly along the rail 109 also moves the cured multilayer structure 113. Thus, in step S212 the cured multilayer structure 113 moves from the second location where the curing station 107 is located to the first location where the planarizing station 105 is located. As noted above, during the return trip to the planarizing station 105, as the multilayer structure 113 passes under the detector 139, the detector can again be operated to detect particles located on the upper surface 141 of the superstrate 108. Any detected particles (new or previously unremoved) can then be removed using the particle removal device 143.

Figure 3I:
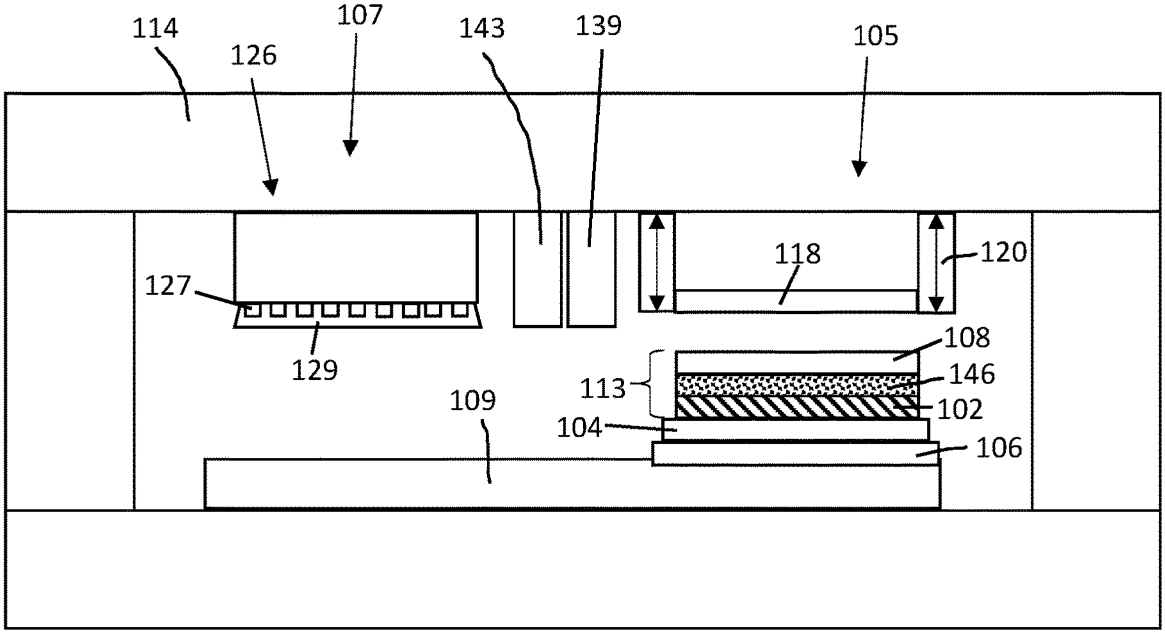

FIG. 3I shows a schematic cross section of planarizing station 105 and the curing station 107 within housing 114 at a moment when cured multilayer structure 113 has arrived back at the planarizing station 105. As shown in FIG. 3I, at this moment, the cured multilayer structure 113 is once again beneath the superstrate chuck 118 and the planarization head 120.

The planarization method 200 may then proceed to step S214, where the superstrate 108 is separated from the cured layer 146. To remove the superstrate 108 from the cured layer 146 the superstrate chuck 118 may be coupled once again to the superstrate 108 (i.e., rechucking the superstrate 108) via operation of the planarization head 120, while the superstrate 108 is still in contact with the cured layer 146. Once the superstrate 108 is coupled with the superstrate chuck 108, the superstrate chuck 118 may begin to lift upwardly away from the substrate 102, via operation of the planarization head 120. Because the superstrate 108 is coupled with superstrate chuck 118, the lifting force will cause the superstrate 108 to separate from the cured layer 146. The separating force may be applied through several different methods. For example, the separating force may be applied by a pin pushing up on the superstrate 108, by a vacuum pulling up on the upper surface 141 of the superstrate 108, and/or by applying a high pressure jet of air at the intersection of the cured layer 146 and the superstrate 108.

Figure 3J:
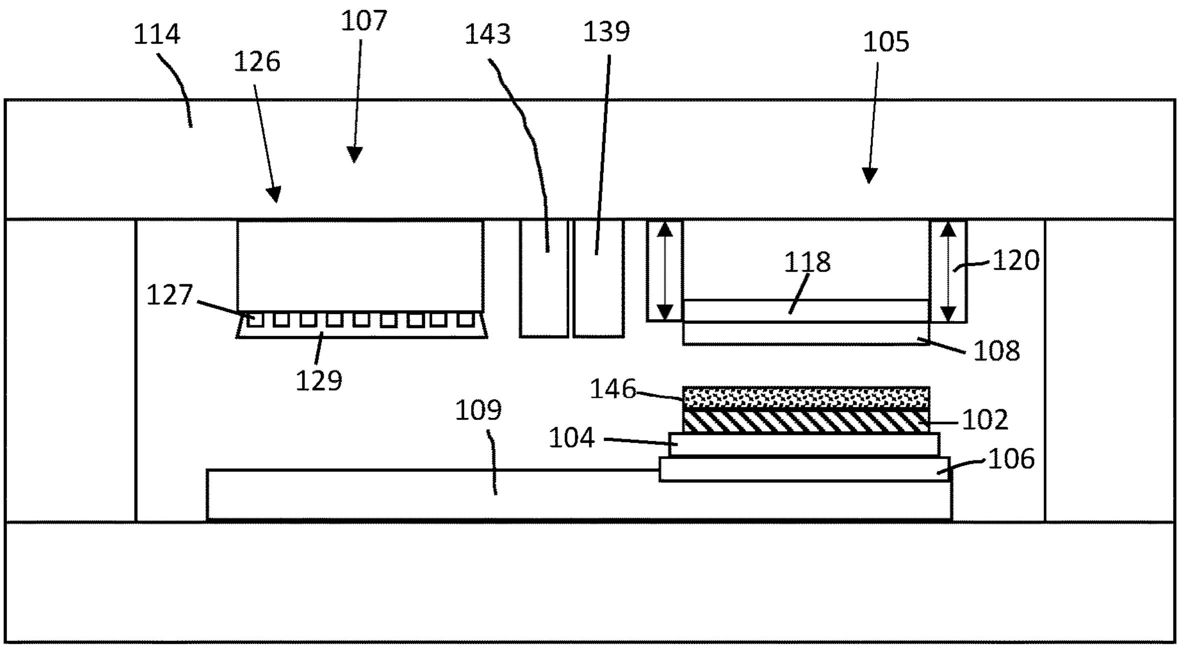
Figure 3K:
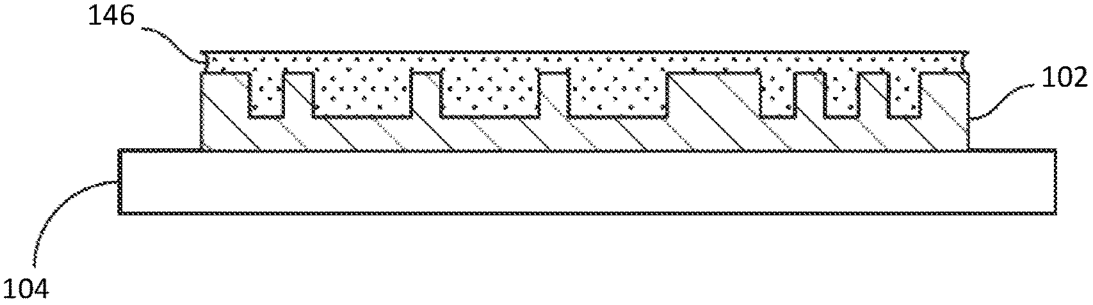

FIG. 3J shows a schematic cross section of planarizing station 105 and the curing station 107 within housing 114 at a moment after the superstrate 108 has separated from the cured layer 146. As shown in FIG. 3J, at this moment, the superstrate 108 is once again in the starting position shown in FIG. 3A, while the cured layer 146 is exposed on the substrate 102. FIG. 3K shows a more detailed schematic cross section of the substrate 102 after the superstrate 108 has been removed from the cured layer 146, i.e., after the completion of step S214. That is, FIG. 3K shows the completed cured planarized layer 146 on the substrate 102. The substrate 102 and the cured layer 146 may then be subjected to additional known steps and processes for device (article) fabrication, including, for example, patterning, curing, oxidation, layer formation, deposition, doping, planarization, etching, formable material removal, dicing, bonding, and packaging, and the like. The substrate 102 may be processed to produce a plurality of articles (devices). These additional steps may be performed by removing the substrate 102 having the exposed cured layer 146 from the housing 114 to a distinct location. Once the substrate 102, having the exposed cured layer 146, is removed from the housing 114, the planarizing station 105 and curing station 107 are ready to receive a new substrate with formable material and repeat the above process.

Figure 4:
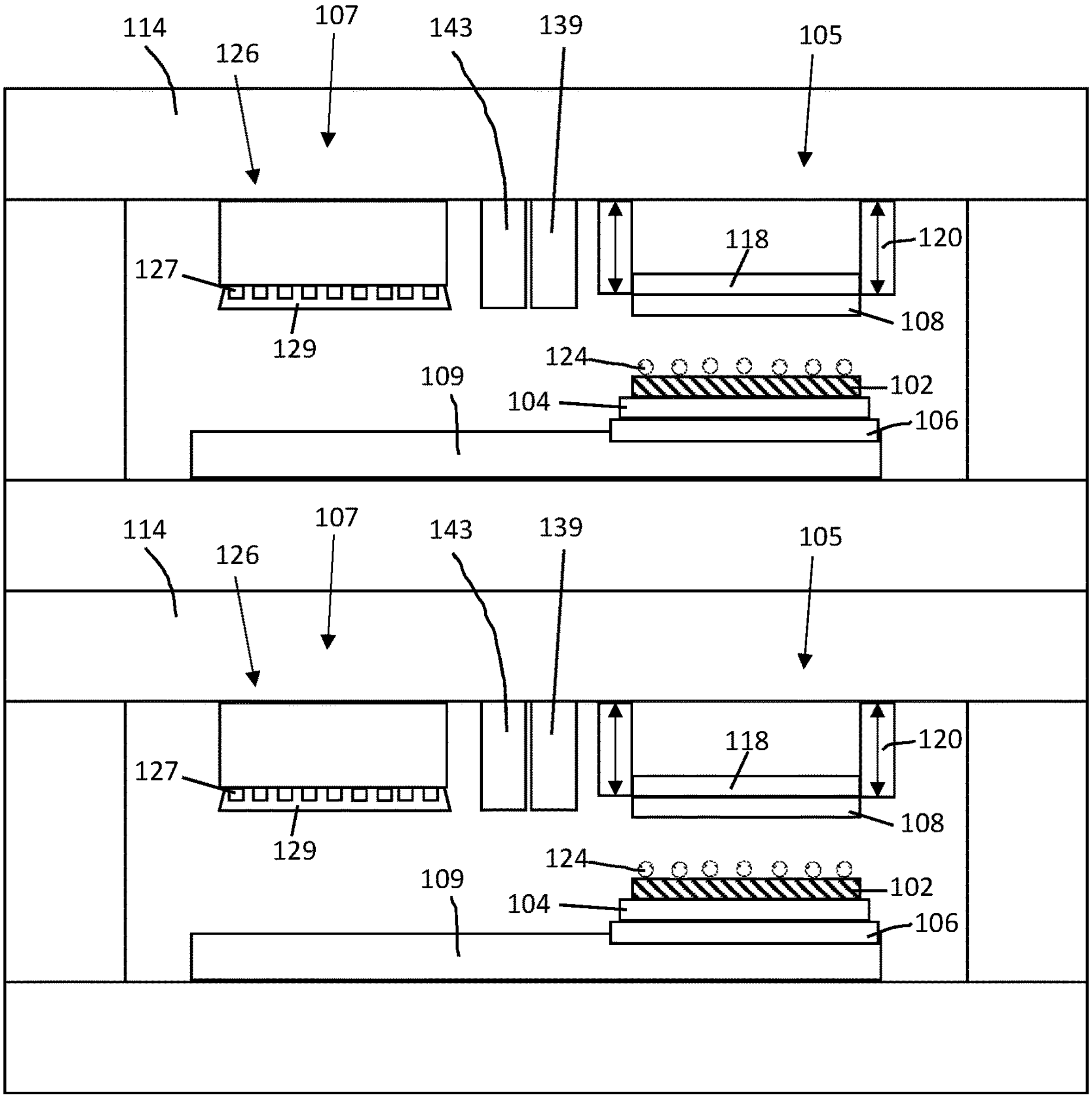
FIG. 4 is a schematic cross section showing a part of the planarization system in accordance with another aspect of the present disclosure.

FIG. 4 shows a schematic cross section of an example embodiment where the planarization system 100 includes two stacked housings 114, each housing 114 including a planarizing station 105 and a curing station 107. As shown in FIG. 4, each housing 114 has identical structure, including the stations 105, 107. By having multiple stacked units of housings with stations, multiple substrates 102 with formable material 124 can proceed through the same process described above at the same time. The structure described above with respect to the curing station 107 makes it physically possible to have stacked units. In particular, by using an array of LEDs 127 and diffuser 129 as the radiation source 126, the curing station 107 has a much smaller profile than other systems where the radiation source is more structurally complex requiring the above-noted optical components that are not present in FIG. 4 (e.g., dichroic mirrors, beam combiners, prisms, lenses, mirrors, etc.). While two housings 114 are shown being stacked in FIG. 4, the planarization system 100 may include more housings 114 each comprising the stations 105, 107. This may be achieved by stacking additional housings 114 each comprising the stations 105, 107 and/or by placing stacked housings 114 side by side, where each housing has the stations 105, 107. In an example embodiment, the planarization system 100 may include from 1 to 20 housings 114, each comprising the stations 105, 107. Other examples include 5 to 15 or 8 to 12 housings 114, each comprising the stations 105, 107. In an example embodiment, the number of housings 114 that can be stacked in a single stack may be 2 to 10. Other examples include 3 to 8 or 5 to 7 housings 114 in a single stack. The compact structure that allows for stacking greatly increases manufacturing throughput as compared to other systems that require more physical space.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method of planarizing a substrate comprising:

dispensing formable material onto a first substrate;

contacting, at a planarizing station at a first location, a first superstrate held by a superstrate chuck with the formable material on the first substrate, thereby forming a first multilayer structure including the first superstrate, a first film of the formable material, and the first substrate;

releasing the first superstrate from the superstrate chuck;

moving the first multilayer structure from the first location to a curing station located at a second location away from the first location;

while the first multilayer structure is being transferred between the planarizing station and the curing station, detecting incomplete spread of the formable material within the first multilayer structure;

in a case that the detected incomplete spread is above a threshold, aborting curing of the first film of the formable material;

removing the first film of the formable material from the first substrate;

dispensing formable material onto a second substrate;

contacting, at the planarizing station at the first location, a second superstrate held by the superstrate chuck with the formable material on the second substrate, thereby forming a second multilayer structure including the second superstrate, a second film of the formable material, and the second substrate;

subsequently releasing the second superstrate from the superstrate chuck;

moving the second multilayer structure from the first location to the curing station;

curing, at the curing station, the second film of the formable material of the second multilayer structure.

2. The method of claim 1, wherein the curing station includes an array of light-emitting diodes and a diffuser configured to spread the light emitted from the light-emitting diodes, and wherein the planarizing station and the curing station are contained within a common housing.

3. The method of claim 1, wherein the moving of the first multilayer structure from the planarizing station to the curing station comprises linearly translating the first multilayer structure.

4. The method of claim 3, wherein the first multilayer structure is linearly translated via a rail extending from the planarizing station to the curing station.

5. The method of claim 1, wherein the detection further comprises detecting one or more of:

a) a presence of particles between the first superstrate and the first substrate of the first multilayer structure, b) a presence of particles on an upper surface of the first superstrate of the first multilayer structure, and c) a presence of scratches on the upper surface of the first superstrate of the first multilayer structure.

6. The method of claim 5, where the detecting is performed by a detector located between the planarizing station and the curing station.

7. The method of claim 5, wherein, in a case that b) the presence of particles are detected on the upper surface of the first superstrate, removing the detected particles.

8. The method of claim 7, wherein the detected particles are removed as the first multilayer structure is being transferred from the planarizing station to the curing station.

9. The method of claim 7, wherein the detected particles are removed via a vacuum or an electrostatic tool located between planarizing station and the curing station.

10. The method of claim 5, wherein the aborting, the removing, the dispensing, the contacting, the releasing, and the moving steps are also performed before curing in case that a) the presence of particles between the first superstrate and the first substrate of the first multilayer structure are detected.

11. The method of claim 5, wherein the aborting, the removing, the dispensing, the contacting, the releasing, and the moving steps are also performed before curing in case that c) the presence of scratches on the upper surface of the first superstrate of the first multilayer structure are detected.

12. The method of claim 1, further comprising, after the curing, moving the second multilayer structure from the curing station to the planarizing station.

13. The method of claim 12, further comprising, removing the second superstrate from the cured film of the second multilayer structure at the planarizing station.

14. The method of claim 2, wherein the first superstructure and the second superstrate is transparent with respect to the light emitted from the light-emitting diodes.

15. The method of claim 2, wherein the superstrate chuck is not transparent with respect to the light emitted from the light-emitting diodes.

16. The method of claim 1, wherein the dispensing of the formable material is performed at a dispensing station located a third location away from the first location and the second location.

17. A planarization system, comprising:

a substrate chuck configured to hold a substrate;

a superstrate chuck configured to hold a superstrate;

a positioning stage;

a dispensing system configured to dispense formable material;

a planarizing station configured to contact, at a first location, the dispensed formable material on a first substrate with a first superstrate to form a first multilayer structure including the first superstrate, a first film of the formable material, and the first substrate;

a curing station located at a second location away from the first location; and a detector configured to detect incomplete spread of the formable material within the first multilayer structure while the first multilayer structure is being transferred between the planarizing station and the curing station, wherein the superstrate chuck is further configured to release the superstrate, wherein the positioning stage is configured to move the first multilayer structure from the planarizing station to the curing station after the first superstrate has been released, wherein in a case that the detector detects incomplete spread that is above a threshold, the planarization system is configured to:

abort curing of the first film of the formable material, remove the first film of the formable material from the first substrate, dispense formable material onto a second substrate via the dispensing system, contact, at the planarizing station, a second superstrate with the formable material on the second substrate to form a second multilayer structure including the second superstrate, a second film of the formable material, and the second substrate, subsequently release the second superstrate from the superstrate chuck;

move the second multilayer structure from the first location to the curing station;

wherein, when the second multilayer structure is located at the curing station, the curing station is configured to cure the second film of the formable material of the second multilayer structure.

18. The planarization system of claim 17, further comprising:

a first housing containing the planarizing station and the curing station; and a second housing containing an additional planarizing station and an additional curing station, wherein the second housing is stacked on the first housing.

19. A method of manufacturing an article, comprising:

dispensing formable material onto a first substrate;

contacting, at a planarizing station at a first location, a first superstrate held by a superstrate chuck with the formable material on the first substrate, thereby forming a first multilayer structure including the first superstrate, a first film of the formable material, and the first substrate;

releasing the first superstrate from the superstrate chuck;

moving the first multilayer structure from the first location to a curing station located at a second location away from the first location;

while the first multilayer structure is being transferred between the planarizing station and the curing station, detecting incomplete spread of the formable material within the first multilayer structure;

in a case that the detected incomplete spread is above a threshold, aborting curing of the first film of the formable material;

removing the first film of the formable material from the first substrate;

dispensing formable material onto a second substrate;

contacting, at the planarizing station at the first location, a second superstrate held by the superstrate chuck with the formable material on the second substrate, thereby forming a second multilayer structure including the second superstrate, a second film of the formable material, and the second substrate;

subsequently releasing the second superstrate from the superstrate chuck;

moving the second multilayer structure from the first location to the curing station;

curing, at the curing station, the second film of the formable material of the second multilayer structure; and processing the cured film to make the article.

* * * * *